US008148684B2

(12) United States Patent
Yoshikawa

(10) Patent No.: US 8,148,684 B2

(45) Date of Patent: Apr. 3, 2012

(54) ELECTRON BEAM APPARATUS

(75) Inventor: Mitsutoshi Yoshikawa, Tokyo (JP)

(73) Assignee: JEOL Ltd., Tokyo (JP)

( * ) Notice: Subject to any disclaimer, the term of this patent is extended or adjusted under 35 U.S.C. 154(b) by 163 days.

(21) Appl. No.: 12/813,064

(22) Filed: Jun. 10, 2010

(65) Prior Publication Data

US 2011/0006209 A1 Jan. 13, 2011

(30) Foreign Application Priority Data

Jul. 8, 2009 (JP) ................................ 2009-161532

(51) Int. Cl.
*G01N 23/00* (2006.01)
*G21K 5/00* (2006.01)

(52) U.S. Cl. ...................... 250/310; 250/306; 250/492.3

(58) Field of Classification Search .......... 250/306–311, 250/396 R–400, 492.3
See application file for complete search history.

(56) References Cited

U.S. PATENT DOCUMENTS

2007/0102651 A1* 5/2007 Yang .......................... 250/492.3
2007/0138388 A1* 6/2007 Ward et al. .................... 250/288

FOREIGN PATENT DOCUMENTS

JP 2008010177 A * 1/2008

* cited by examiner

*Primary Examiner* — Jack Berman
*Assistant Examiner* — David E Smith
(74) *Attorney, Agent, or Firm* — The Webb Law Firm

(57) ABSTRACT

An electron beam apparatus has the electron optical column for releasing an electron beam from the front-end portion after the beam is emitted from an electron beam source located on a rear-end portion of the column, a specimen chamber connected to a front-end portion of the column, and an aperture member withdrawably disposed in the front-end portion of the column within the specimen chamber. The apparatus further includes a rotating mechanism for rotating the aperture member along a given plane lying along the direction of a path of the beam. Thus, the aperture member can be attached and detached to and from the front-end portion of the column.

7 Claims, 4 Drawing Sheets

ELECTRON BEAM APPARATUS

BACKGROUND OF THE INVENTION

1. Field of the Invention

The present invention relates to an electron beam apparatus, such as a scanning electron microscope enabling imaging of a specimen under low-vacuum condition.

2. Description of Related Art

FIG. 1 is a schematic cross section of main portions of a scanning electron microscope capable of low-vacuum imaging of specimens. In FIG. 1, the microscope has an electron optical column 1 where there is formed a beam passage 4 through which an electron beam 5 travels. The passage 4 is a tubular passageway. The beam 5 transmitted through the passage 4 is released from the front end of the electron optical column 1 via the front end of an objective lens 3 disposed in a front-end portion of the electron optical column 1. An electron gun acting as an electron beam source, deflection coils, and other components (none of which are shown) are mounted in the column 1.

The front-end portion of the electron optical column 1 is attached to a specimen chamber 2. The beam 5 released from the front end of the column 1 is made to impinge on a specimen 6 placed within the specimen chamber 2. At this time, the beam 5 impinging on the specimen 6 is deflected by the deflection coils and scanned over the specimen 6.

During scanning of the electron beam 5, a scan current based on a given scan signal is supplied to the deflection coils to activate the coils, thus deflecting the beam 5.

Electrons (not shown) to be detected, such as backscattered electrons, are produced from the specimen 6 irradiated with the electron beam 5. The electrons evolved from the specimen 6 in this way are detected by an electron detector (not shown) mounted in the specimen chamber 2. A scanned image of the specimen 6 is created based on a detection signal produced from the detector and on the scan signal, and the image is displayed. An operator who manipulates the scanning electron microscope can observe the specimen by visually checking the displayed image. When low-vacuum imaging of the specimen 6 is performed in this way, backscattered electrons more energetic than secondary electrons are often detected.

When low-vacuum imaging of the specimen 6 is performed, it is necessary that the vacuum ambient inside the specimen chamber 2 where the specimen 6 is placed be made lower in degree of vacuum than the vacuum ambient inside the beam passage 4 in the electron optical column 1; that is, made a high-vacuum ambient. (The pressure of a "high-vacuum" condition is lower than the pressure of a "low-vacuum" condition.) Accordingly, the scanning electron microscope for low-vacuum imaging as shown in FIG. 1 is so designed that differential pumping is effected between the inside of the beam passage 4 and the inside of the specimen chamber 2 to maintain the low-vacuum ambient inside the specimen chamber 2 while retaining the high-vacuum ambient inside the beam passage 4 of the electron optical column 1.

In particular, an aperture 8 is disposed in the front-end portion of the beam passage 4 of the electron optical column 1, the aperture 8 being provided with an opening 8*a* for the differential pumping. The inside of the beam passage 4 and the inside of the specimen chamber 2 are pumped down by their respective vacuum pumping systems. At this time, the inside of the beam passage 4 is set to a high degree of vacuum. On the other hand, the inside of the specimen chamber 2 is set to a lower degree of vacuum.

The opening 8*a* in the aperture 8 is made so small that the low-vacuum ambient inside the specimen chamber 2 hardly affects the high-vacuum ambient inside the beam passage 4. However, the beam 5 can pass through the opening 8*a*.

In the configuration shown in FIG. 1, the aperture 8 is placed on an aperture holder 7 that is composed of a convex portion and a body portion 7*b*. The aperture 8 is held on the top surface of the convex portion, which is located within the beam passage 4 in a front-end portion of the objective lens 3 of the electron optical column 1. Consequently, the aperture 8 held on the top surface of the convex portion is placed within the beam passage 4 in the front-end portion of the objective lens 3.

A through-hole 7*a* is formed in the aperture holder 7 and extends through the convex portion and body portion 7*b* of the aperture holder 7. Consequently, the beam 5 traveling in the beam passage 4 of the electron optical column 1 passes through the opening 8*a* in the aperture 8 and through the through-hole 7*a* in the holder 7 and reaches the specimen 6 in the specimen chamber 2.

In the specimen chamber 2, the aperture holder 7 is placed at the front end of the objective lens 3 as shown and supported by plural springs 9. That is, one end of each spring 9 is mounted to the body portion 7*b* of the aperture holder 7, while the other end is anchored to a support block 10 held to the top inner wall surface of the specimen chamber 2. In consequence, the aperture holder 7 is supported within the specimen chamber 2 via the springs 9 anchored to the support blocks 10.

Some known apparatus have lifting devices for moving up and down the differential pump and a horizontal drive mechanism for moving the differential pumping aperture horizontally after the aperture has descended, in addition to the support structure (FIG. 1) holding the aperture 8 (see JP-A-2008-010177).

In the scanning electron microscope adapted for low-vacuum imaging and designed as shown in FIG. 1, the aperture holder 7 holding the aperture 8 is held in the specimen chamber 2 via the springs 9 as described previously. In this support structure, the aperture holder 7 is kept held inside the specimen chamber 2. If the imaging mode is switched to high-vacuum imaging of the specimen 6, the aperture 8 stays intact in the beam passage 4.

Under this condition, even during high-vacuum imaging mode after switching of the imaging mode, the field of view and the imaging position are limited by the existence of the aperture 8 in the same way as in low-vacuum imaging mode. That is, the area of the specimen irradiated with the electron beam 5 directed from the front end of the electron optical column 1 (i.e., the front end of the objective lens 3) toward the specimen 6 is affected by the size of the opening 8*a* in the aperture 8. As a result, the area illuminated by the beam 5 is restricted. Consequently, the field of view and imaging position on the specimen 6 are restricted during imaging.

Accordingly, when the imaging mode is switched from low-vacuum imaging to high-vacuum imaging, it is necessary to retract the aperture 8 from the front end of the electron optical column 1 such that the opening 8*a* in the aperture 8 completely gets out of the path of the beam 5 by moving the aperture holder 7. However, in the structure of the apparatus described above, the following sequence has been necessary. That is, the internal ambient of the specimen chamber 2 is once restored to atmospheric pressure. Then, one sidewall 2*a* of the specimen chamber 2 is opened to open the inside of the specimen chamber 2. The springs 9 are removed from the support block 10 through the opening made in this way by a manual work of an operator. The holder 7 and aperture 8 are manually taken out of the specimen chamber 2 together with the springs 9. Thereafter, the sidewall 2*a* is moved to close the opening. Then, the inside of the specimen chamber 2 is pumped down to a desired high degree of vacuum.

When the aperture 8 is located within the beam passage 4, if the electron beam 5 hits a region around the opening 8*a* in the aperture 8, the aperture 8 is contaminated. In this case, the aperture 8 needs to be replaced as appropriate. However, in this replacing operation, too, a long sequence is needed. That is, after the springs 9 are removed from the support block 10, the aperture holder 7 and aperture 8 are removed from the front end of the objective lens 3. The holder 7 and aperture 8 are manually taken out of the specimen chamber 2 together with the springs 9. Then, the aperture 8 is replaced.

In the apparatus described in JP-A-2008-010177, the differential pumping aperture can be attached and detached from the objective lens without restoring the pressure inside the specimen chamber to atmospheric pressure. However, in this apparatus, when the aperture is removed from the objective lens, the operator manually manipulates the knob mounted on an external surface of the specimen chamber to lower the aperture in the vertical direction and then to move it horizontally. In this way, some manual operations are performed. During this process, it is necessary that the operator hold out his or her hand to the specimen chamber and perform some manual operations. There remains room for improvement for enhancing the controllability.

Furthermore, in the above-described structure that needs two stages of operations (i.e., a vertical motion and then a horizontal motion), if a discussion is effected to automate mounting and dismounting of the aperture using a drive means, such as a motor, it is conceivable that the structure of the apparatus will be complicated.

SUMMARY OF THE INVENTION

It is an object of the present invention to provide an electron beam apparatus which has an electron optical column including a front-end portion forming a front-end portion of an objective lens and a simple mechanism performing simple operations to automatically attach or detach an aperture member to or from a front end of the column.

An electron beam apparatus, according to a first embodiment of the present invention, has an electron optical column having a rear-end portion, a specimen chamber connected with a front-end portion of the column, and an aperture member withdrawably disposed in a front end of the column within the specimen chamber. An electron beam source is mounted on the rear-end portion of the column and emits an electron beam. The electron optical column releases the beam from the front end. The aperture member is attached or detached to or from the front end of the column by rotating the aperture member along a given plane that lies along the direction of a path of the beam.

An electron beam apparatus, according to a second embodiment of the present invention, has an electron optical column having a rear-end portion, a specimen chamber connected with a front-end portion of the column, and an aperture member withdrawably disposed in a front end of the column within the specimen chamber. An electron beam source is mounted on the rear-end portion of the column and emits an electron beam. The electron optical column releases the beam from the front end. The apparatus further includes a rotating mechanism for rotating the aperture member along a given plane that lies along the direction of a path of the beam such that the aperture member can be attached and detached to and from the front end of the column.

In the present invention, an aperture member is rotated along a given plane lying along the direction of a path of an electron beam. This permits the aperture member to be attached or detached to or from the front end of the electron optical column. Especially, in the electron beam apparatus according to the second embodiment, there is provided the rotating mechanism which permits the aperture member to be attached or detached to or from the front end of the column by rotating the aperture member as described above.

Consequently, in the present invention, simple operations and simple mechanisms enable automation of attachment and detachment of the aperture member to and from the front end of the column.

Other objects and features of the invention will appear in the course of the description thereof, which follows.

DESCRIPTION OF THE PREFERRED EMBODIMENTS

Figure 1:
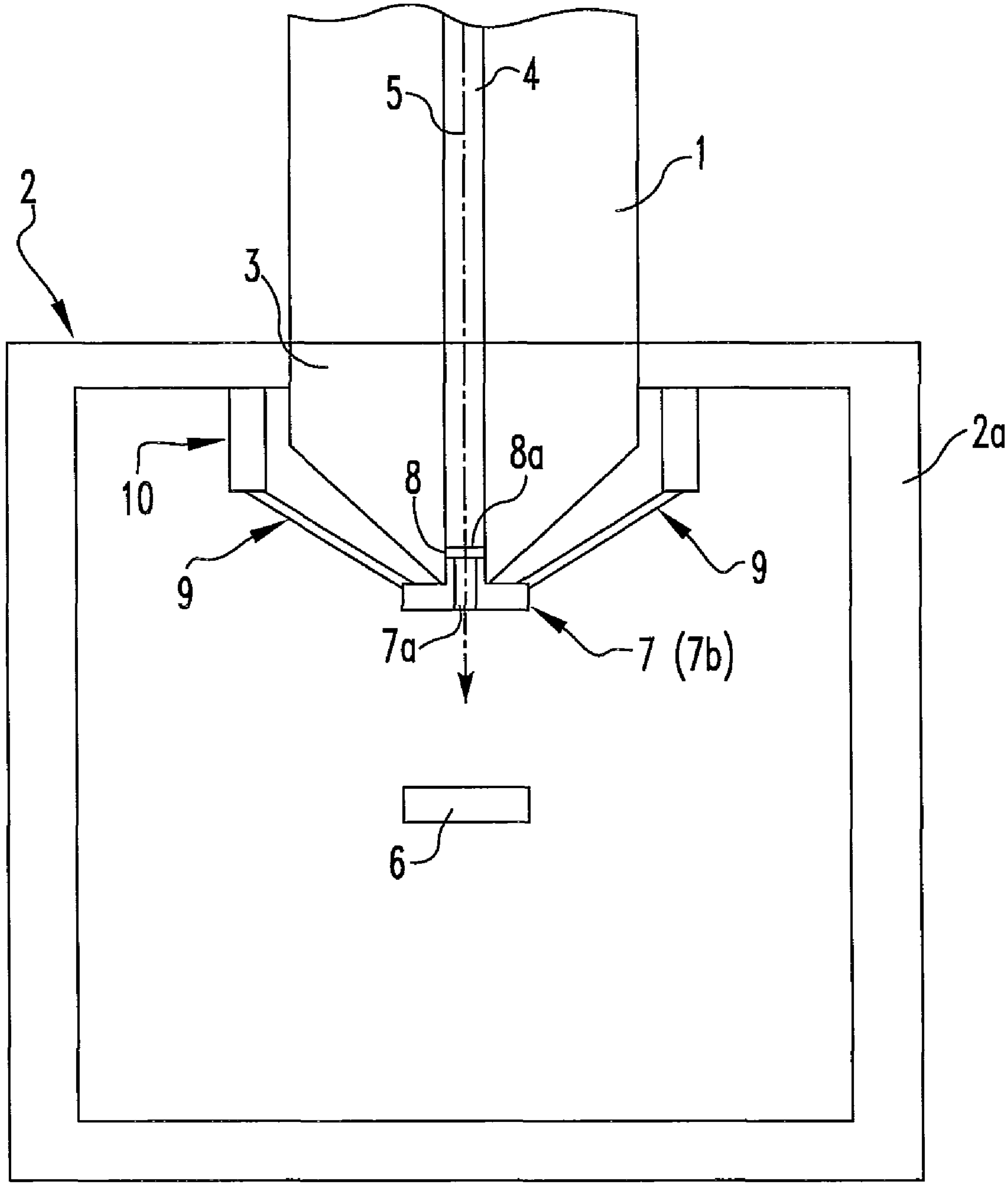
FIG. 1 is a schematic vertical cross section of a conventional scanning electron microscope for low-vacuum imaging.
Figure 2:
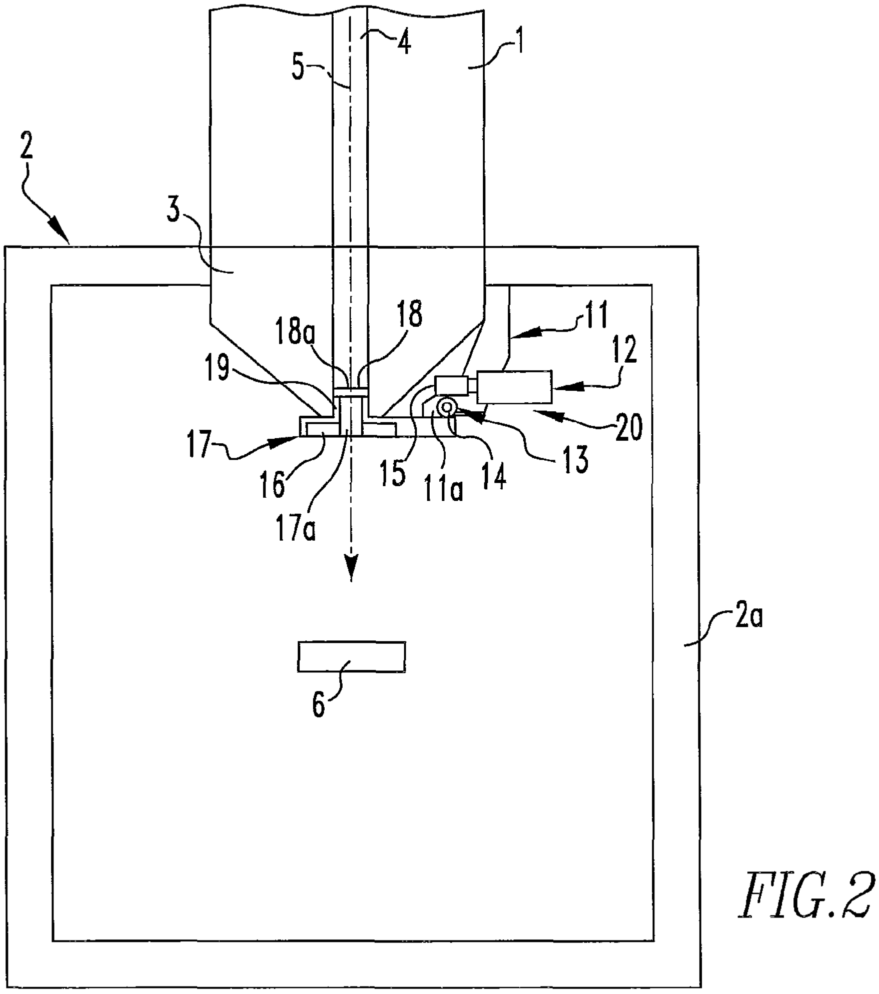
FIG. 2 is a schematic vertical cross section of a scanning electron microscope according to the present invention, the microscope having low-vacuum imaging capabilities.

The preferred embodiments of the present invention are hereinafter described with reference to the drawings. FIG. 2 is a schematic cross section of main portions of a scanning electron microscope, according to the present invention, the microscope having low-vacuum imaging capabilities. Note that in both FIGS. 1 and 2, like components are indicated by like reference numerals.

Referring to FIG. 2, a beam passage 4 through which an electron beam 5 passes is formed in an electron optical column 1. The passage 4 is made of a tubular passageway. The beam 5 traveling in the passage 4 is released from the front end (i.e., the front end of an objective lens 3) of the electron optical column 1 via the objective lens 3 disposed in a front-end portion of the column 1.

An electron gun (not shown) acting as an electron beam source is equipped on the base-end side of the electron optical column 1. The gun emits the electron beam 5 by a given accelerating voltage. The beam 5 released from the gun passes through the beam passage 4 inside the column 1. Deflection coils (not shown) and other components are mounted in the column 1.

The front-end portion of the electron optical column 1 is attached to a specimen chamber 2. The electron beam 5 released from the front end of the column 1 is made to hit a specimen 6 placed in the specimen chamber 2. At this time, the beam 5 impinging on the specimen 6 is deflected by the deflection coils and scanned over the specimen 6.

During the scanning of the electron beam 5, a scan current based on a given scan signal is supplied to the deflection coils, energizing them. As a result, the beam 5 is deflected.

Electrons (not shown) to be detected, such as backscattered electrons, are produced from the specimen 6, irradiated, and scanned with the electron beam 5. The electrons generated from the specimen 6 in this way are detected by an electron detector 16 mounted in the specimen chamber 2. A scanned image of the specimen 6 is created based on a detection signal produced from the detector 16 and on the scan signal, and the image is displayed by a display device (not shown). The operator can observe the specimen by visually checking the displayed image.

In the present embodiment, the electron detector 16 is a backscattered electron detector that detects backscattered electrons. The detector 16 is mounted on the bottom surface of an aperture holder 17.

FIG. 2 shows the state in which the apparatus performs low-vacuum imaging. An aperture 18 provided with an opening 18*a* is disposed in the front-end portion of the beam passage 4 of the electron optical column 1. The aperture 18 permits differential pumping to be done to hold a low-vacuum ambient inside the specimen chamber 2 while maintaining the high-vacuum ambient inside the beam passage 4 of the column 1.

The inside of the beam passage 4 and the inside of the specimen chamber 2 are pumped down by their respective vacuum pumping systems. When low-vacuum imaging is performed, the inside of the beam passage 4 is set to a high degree of vacuum, while the inside of the specimen chamber 2 is set to a lower degree of vacuum.

The opening 18*a* in the aperture 18 is made so small that the low-vacuum ambient inside the specimen chamber 2 hardly affects the high-vacuum ambient inside the beam passage 4. However, the beam 5 can pass through the opening 18*a*.

Figure 4:
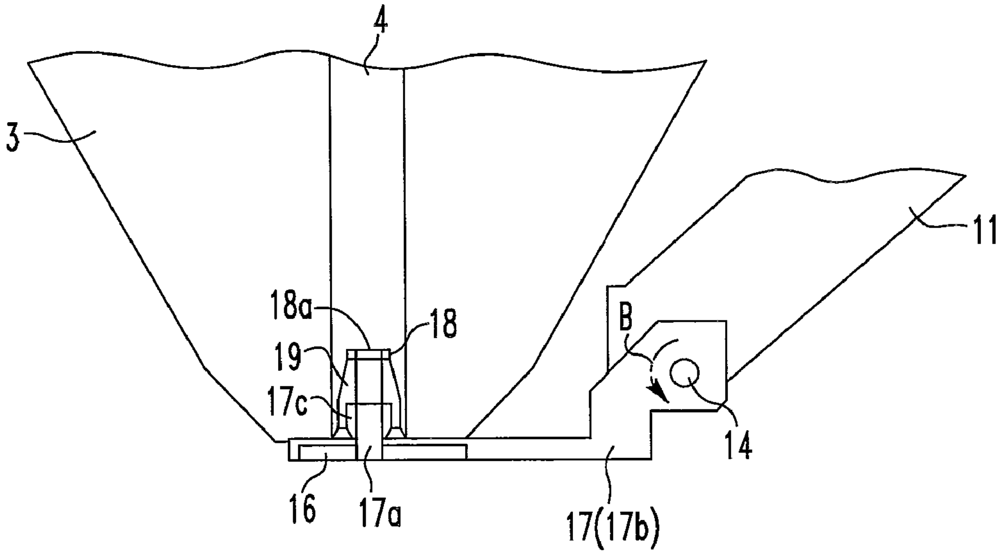
FIG. 4 is a schematic vertical cross section similar to FIG. 2, but in which an aperture holder is in contact with the front-end portion of an objective lens.

The aperture 18 is placed on the aperture holder 17, which is positioned within the specimen chamber 2. Referring to FIG. 4, the aperture holder 17 is composed of a body portion 17*b* and an aperture support portion 19 arranged on the front end of the body portion 17*b*. The aperture support portion 19 is in engagement with a convex portion 17*c* formed at the front end of the body portion 17*b*. The convex portion 17*c* is externally threaded, whereas the aperture support portion 19 is internally threaded. When these threads engage, the aperture support portion 19 engages the convex portion 17*c*.

The aperture holder 17 and the aperture 18 together constitute an aperture member. The aperture support portion 19 engaging with the convex portion 17*c* forms the protrusive portion of the aperture member. The electron detector 16 is placed on the bottom surface of the aperture holder 17 and faces away from the convex portion 17*c*. A through-hole 17*a* extending through the aperture support portion 19, convex portion 17*c*, and detector 16 is formed in a front-end portion of the aperture holder 17. The opening 18*a* in the aperture 18 held on the aperture support portion 19 is located in alignment with the through-hole 17*a*. The electron beam 5 passing through the beam passage 4 of the electron optical column 1 passes through the opening 18*a* in the aperture 18 and then through the through-hole 17*a* in the aperture holder 7 and reaches the specimen 6 in the specimen chamber 2.

A rod-like or cylindrical rotatable shaft 14 is held to the base end of the aperture holder 17. The longitudinal direction of the shaft 14 lies in the horizontal direction and is perpendicular to the direction of motion (vertical direction) of the electron beam 5. The shaft 14 extends through a front-end portion 11*a* of the support member 11.

Figure 3:
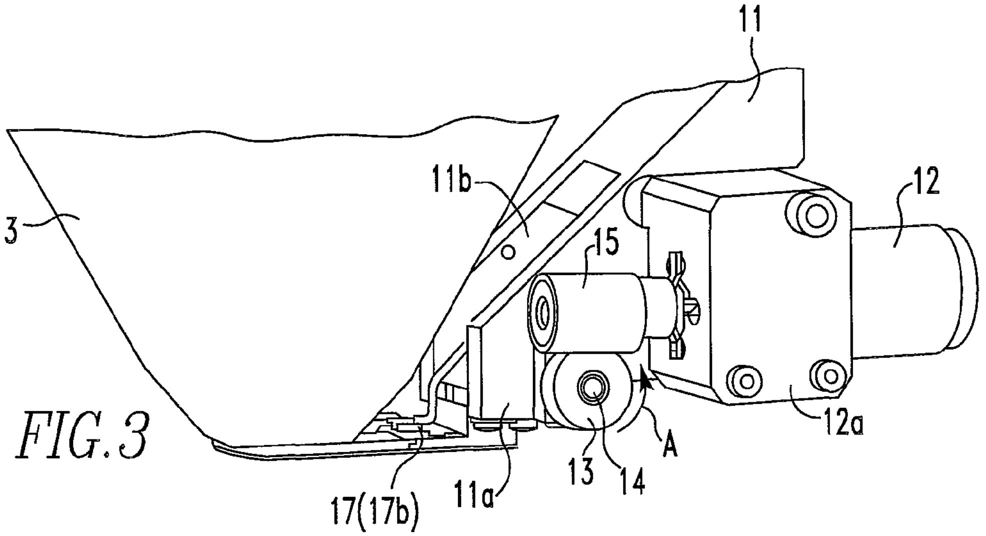
FIG. 3 is a perspective view of a rotating mechanism, according to the present invention, showing the structure of the mechanism.

As shown in FIG. 3, the front-end portion 11*a* of the support member 11 has a cutout 11*b* and, thus, is bifurcated. The base-end portion of the aperture holder 17 is located inside the cutout 11*b*, and the shaft 14 attached to the base-end portion rotatably extends through the front-end portion 11*a* of the support member 11. The shaft 14 extends through the base-end portion of the aperture holder 17 and is held to it. The holder 17 is supported to the support member 11 via the shaft 14. A toothed wheel 13 is mounted to one end of the shaft 14 extending through the front-end portion 11*a* of the support member 11.

A motor 12 is mounted to one side surface of the support member 11 via a holding member 12*a*. A worm gear 15 is mounted to the rotating shaft of the motor 12 and in mesh with the toothed wheel 13.

As the motor 12 is driven, the worm gear 15 is rotated together with the rotating shaft of the motor. This rotates the toothed wheel 13 in mesh with the worm gear 15, thus rotating the shaft 14. Consequently, the aperture holder 17 is rotated while the aperture 18 is carried on it.

At this time, the aperture holder 17 rotates along the given plane lying along the direction of motion (vertical direction) of the electron beam 5. The toothed wheel 13, worm gear 15, and motor 12 together constitute a rotating mechanism 20. The present apparatus is constructed as described so far. The operation is next described by referring to FIGS. 4-6.

In the low-vacuum imaging mode as shown in FIG. 4, the front-end portion of the aperture holder 17 is in contact with the front-end portion of the objective lens 3 of the electron optical column 1. The aperture 18 placed on the aperture support portion 19 located in the front-end portion of the holder 17 is positioned within the beam passage 4 located inside the objective lens 3.

Under this condition, if high-vacuum imaging should be enabled after retracting the aperture 18 from inside the beam passage 4, the motor 12 is driven to rotate the worm gear 15 held to the rotating shaft of the motor 12. As the worm gear 15 turns, the toothed wheel 13 in mesh with it rotates. At this time, the direction of rotation of the toothed wheel 13 is indicated by the arrow A in FIG. 3. The motor 12 rotates the worm gear 15 such that the toothed wheel 13 rotates in the direction indicated by the arrow A.

As a result, the shaft 14 rotates in the direction indicated by the arrow B in FIG. 4 (i.e., in the same direction as the direction indicated by the arrow A). Because the shaft 14 is secured to the base-end portion of the aperture holder 17, as the shaft 14 rotates, the aperture holder 17 rotates in the direction indicated by the arrow B.

Figure 5:
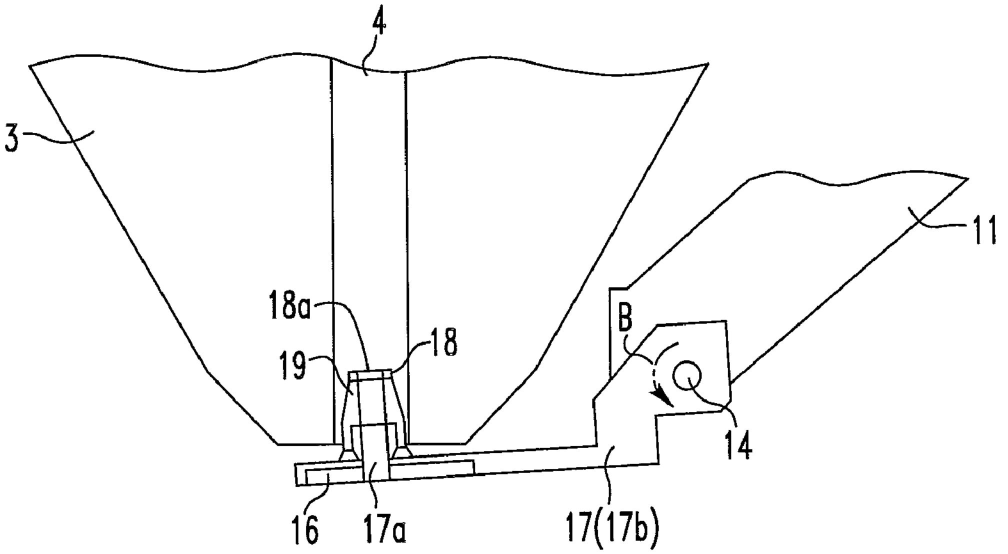
FIG. 5 is a cross section similar to FIG. 4, but in which the aperture holder is out of contact with the front-end portion of the objective lens.

FIG. 5 shows the state in which the aperture holder 17 has just rotated. In this state, the aperture holder 17 is no longer in contact with the front-end portion of the objective lens 3.

Figure 6:
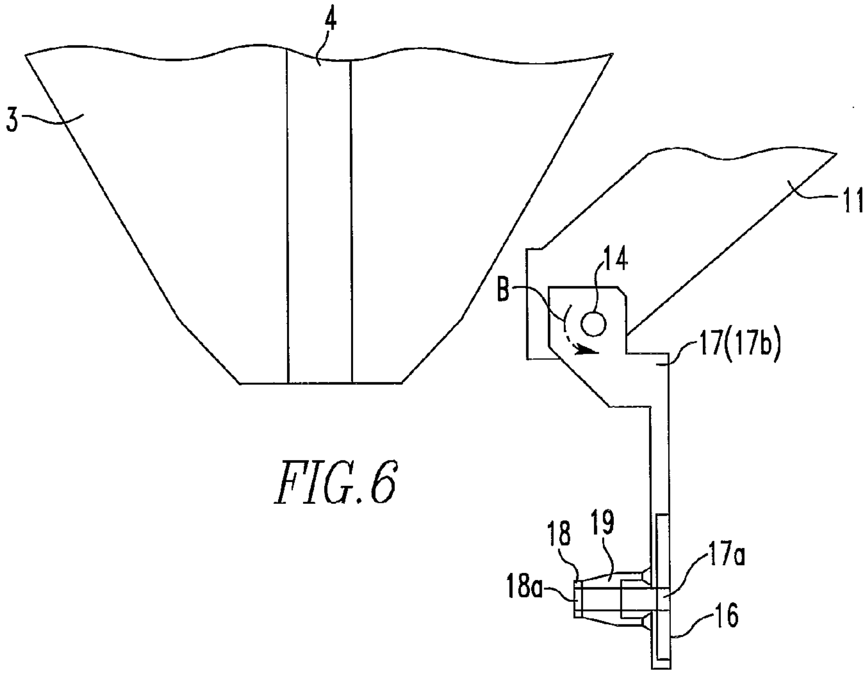
FIG. 6 is a cross section similar to FIG. 5, but in which the aperture holder has been removed from the front-end portion of the objective lens.

When the aperture holder 17 has rotated further, the state shown in FIG. 6 is reached. Under this state, the aperture holder 17 has been removed from the front-end portion of the objective lens 3. The aperture 18 placed on the holder 17 is off the beam passage 4 of the objective lens 3.

Figure 7:
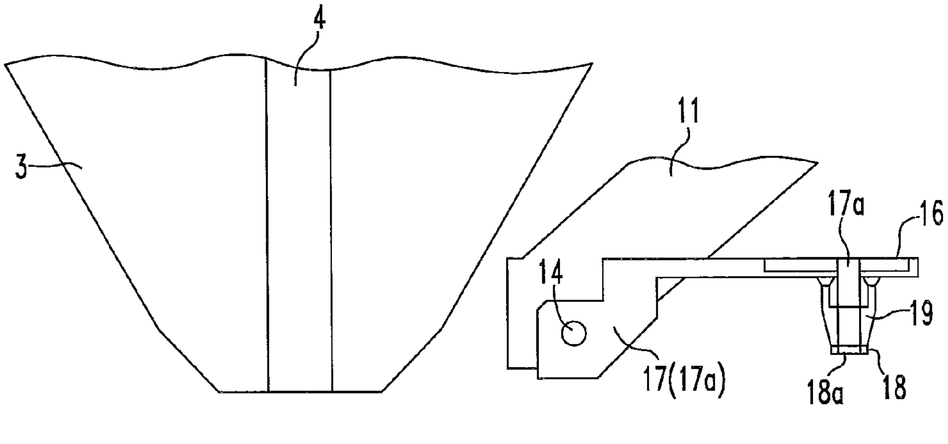
FIG. 7 is a cross section similar to FIG. 6, but in which the aperture holder has been brought into its retracted position after removal from the front-end portion of the objective lens.

When the aperture holder 17 has rotated still further, the state shown in FIG. 7 is reached. Under this state, the holder 17 is located in its retracted position.

These operations are automatically performed by the operation of the motor 12 in response to an operator's operation for switching the imaging mode. At this time, it is not necessary to restore the inside of the specimen chamber 2 to atmospheric pressure. Accordingly, the imaging mode can be switched efficiently in a short time.

When the retracting operations which bring the status of the apparatus from the state of FIG. 4 to the state of FIG. 7 are performed, a specimen stage (not shown) on which the specimen 6 is placed within the specimen chamber 2 is lowered to prevent the aperture holder 17 from contacting or colliding with the specimen stage. The descending motion of the specimen stage is automatically made in response to an operator's operation for switching the imaging mode.

In the state of FIG. 7, the aperture 18 has been retracted from inside the beam passage 4 of the objective lens 3 and so the differential pumping between the inside of the passage 4 and the inside of the specimen chamber 2 is ceased. Therefore, high-vacuum imaging of the specimen 6 can be performed by evacuating the inside of the specimen chamber 2 to a high degree of vacuum. At this time, secondary electrons from the specimen 6 are detected by a secondary electron detector (not shown) disposed in the specimen chamber 2.

In the structure of the rotating mechanism 20 of the present invention, the toothed wheel 13 is rotated by the worm gear 15 mounted to the rotating shaft of the motor 12. Accordingly, if the operation of the motor 12 is stopped, the position of the aperture holder 17 can be retained whether the apparatus is in the state shown in FIG. 4 or the state shown in FIG. 7. That is, if the operation of the motor 12 is stopped, rotation of the toothed wheel 13 is braked by the worm gear 15 in mesh with the wheel.

When the imaging mode is switched from the high-vacuum imaging mode shown in FIG. 7 to the low-vacuum imaging mode, the motor 12 is rotated in the direction reverse to the foregoing direction, thus performing operations reverse to the operations described above. That is, the apparatus is brought from the state of FIG. 7 to the state of FIG. 4 through the states of FIGS. 6 and 5. In the state of FIG. 4, differential pumping can be done as described previously. Under this condition, the inside of the specimen chamber 2 is pumped down to a low-vacuum state. Low-vacuum imaging of the specimen 6 is performed.

Because of the structure described so far, the aperture 18 can be automatically inserted into or out of the beam passage 4 of the electron optical column 1 by driving the motor 12. Consequently, differential pumping can be automatically performed or stopped in response to an operator's operation for switching the imaging mode. Hence, the imaging mode can be automatically switched between low-vacuum imaging and high-vacuum imaging.

Especially, in the high-vacuum imaging mode, the aperture holder 17 on which the aperture 18 is placed is completely retracted from the front-end portion of the objective lens 3 and so the specimen 6 can be brought close to the front end of the objective lens 3. The imaging (working) distance can be shortened. Furthermore, in the high-vacuum imaging mode, it is unlikely that the field of view will be restricted by the aperture 18.

Furthermore, in high-vacuum imaging mode, the aperture 18 is retracted and, thus, is unilluminated with the electron beam 5. Consequently, contamination of the aperture 18 is reduced.

When the aperture 18 is replaced, the aperture 8 is retracted as shown in FIG. 7. Then, the specimen chamber 2 is restored to atmospheric pressure, and the sidewall 2*a* is opened. The operator can insert his or her hand into the specimen chamber 2 through the opened portion and manually replace the aperture 18.

In this case, the aperture 18 can be replaced while the aperture holder 17 is located within the specimen chamber 2. That is, it is possible for the operator to bring the aperture support portion 19 carrying the aperture 18 thereon out of threaded engagement with the convex portion 17*c* of the support portion 19 by manually rotating the support portion 19 inside the specimen chamber 2. In consequence, the aperture support portion 19 can be removed from the convex portion 17*c* together with the aperture 18.

The aperture 18 can be replaced efficiently by bringing the aperture support portion 19 having a new aperture 18 thereon into threaded engagement with the convex portion 17*c*. Then, the sidewall 2*a* is closed, closing off the specimen chamber 2. Subsequently, the inside of the chamber 2 is pumped down.

In the present invention, when the imaging mode is switched from low-vacuum imaging to high-vacuum imaging, the aperture 18 can be automatically taken out of the beam passage 4 by driving the motor 12. During high-vacuum imaging, the specimen can be viewed without the field of view being restricted by the aperture 18.

When the imaging mode has been switched to high-vacuum imaging, the aperture 18 is in its retracted position and so contamination of the aperture 18 can be reduced. Consequently, the usable life of the aperture 18 can be extended. Furthermore, if the aperture 18 that has been considerably contaminated is replaced, the replacing operation can be simplified.

In this way, the electron beam apparatus, according to the present invention, has the electron optical column 1 for releasing the electron beam 5 from its front end after the beam is released from the electron beam source located on the rear-end portion of the column 1, the specimen chamber 2 connected to the front-end portion of the column 1, and the aperture member (including the aperture 18 and the aperture holder 17) detachably disposed in the front end of the column 1 within the specimen chamber 2. The aperture member can be attached and detached to and from the front end of the column 1 by rotating the aperture member along the given plane that lies in the direction of the path of the beam 5.

Especially, in the present invention, there is provided the rotating mechanism 20 that rotates the aperture member along the given plane lying along the direction of the path of the electron beam 5, whereby the aperture member can be attached and detached to and from the front end of the electron optical column 1. The rotating mechanism 20 has the toothed wheel 13 fixedly mounted to the rotating shaft 14 of the aperture member. The rotating mechanism 20 also has the motor 12 mounted to the worm gear 15 in mesh with the wheel 13.

The front-end portion 11*a* of the support member 11 is bifurcated. The base-end portion of the support member 11 is mounted to the objective lens 3. The base-end portion of the aperture holder 17 that forms the aperture member is located in the gap formed by the bifurcated front-end portion 11*a* of the support member 11. The rotating shaft 14 mounted to the base-end portion of the aperture holder 17 extends through the front-end portion 11*a* of the support member 11.

The aperture holder 17 has the protrusive portion formed by the aperture support portion 19 engaging the convex portion 17*c*. The protrusive portion (i.e., the aperture support portion 19) tapers off Consequently, the aperture 18 can be smoothly moved into or out of the beam passage 4 of the objective lens 3 without making contact with the front-end portion of the objective lens 3.

The electron detector 16 for detecting backscattered electrons is mounted on the bottom surface of the aperture holder 17 forming the aperture member, the bottom surface facing away from the side of the holder on which the aperture 18 is placed. Consequently, the electron detector 16 can be positioned within the specimen chamber 2 without complicating the instrumental configuration. That is, a simpler instrumental configuration can be accomplished.

Having thus described my invention with the detail and particularity required by the Patent Laws, what is desired protected by Letters Patent is set forth in the following claims.

The invention claimed is:

1. An electron beam apparatus comprising:

an electron optical column having a rear-end portion and a front-end portion through which an electron beam can emerge;

a specimen chamber connected with a front-end portion of the column;

an aperture member withdrawably disposed at the front-end portion of the column within the specimen chamber; and an electron beam source mounted at the rear-end portion of the column and emitting an electron beam, wherein the aperture member is attached or detached to or from the front-end portion of the column by rotating the aperture member about an axis that lies within a plane perpendicular to the direction of a path of the beam.

2. An electron beam apparatus comprising:

an electron optical column having a rear-end portion and a front-end portion through which an electron beam can emerge;

a specimen chamber connected with a front-end portion of the column;

an aperture member withdrawably disposed in a front-end portion of the column within the specimen chamber;

an electron beam source mounted on the rear-end portion of the column and emitting an electron beam; and a rotating mechanism for rotating the aperture member about an axis that lies within a plane perpendicular to the direction of a path of the beam, whereby the aperture member can be attached and detached to and from the front end of the column.

3. An electron beam apparatus as set forth in claim 2, wherein said rotating mechanism includes a toothed wheel, which is fixedly mounted to a rotating shaft of the aperture member, and a motor, and wherein a worm gear in mesh with the toothed wheel is mounted to the motor.

4. An electron beam apparatus as set forth in claim 3, wherein the aperture member includes a base-end portion having a rotating shaft, wherein a support member has a front-end portion that is bifurcated to define a gap in which the base-end portion of the aperture member is located, and wherein the rotating shaft extends through the front-end portion of the support member.

5. An electron beam apparatus as set forth in any one of claims 1 to 4, wherein said aperture member has a protrusive portion on which an aperture is placed.

6. An electron beam apparatus as set forth in claim 5, wherein said protrusive portion of the aperture member tapers off.

7. An electron beam apparatus as set forth in any one of claims 1 to 4, wherein an electron detector for detecting electrons produced from the specimen is mounted on a surface of the aperture member that faces away from the aperture.

* * * * *